United States Patent
Park et al.

(10) Patent No.: US 9,618,823 B2
(45) Date of Patent: Apr. 11, 2017

(54) PHOTO MIXER AND METHOD FOR MANUFACTURING SAME

(71) Applicant: ELECTRONICS AND TELECOMMUNICATIONS RESEARCH INSTITUTE, Daejeon (KR)

(72) Inventors: Kyung-Hyun Park, Daejeon (KR); Nam-Je Kim, Daejeon (KR); Hyun-Sung Ko, Seoul (KR); Dong-Hun Lee, Daejeon (KR); Sang-Pil Han, Daejeon (KR); Han-Cheol Ryu, Daejeon (KR); Jeong-Woo Park, Daejeon (KR); Ki-Won Moon, Pohang-si (KR); Dae-Yong Kim, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 14/430,182

(22) PCT Filed: Sep. 17, 2013

(86) PCT No.: PCT/KR2013/008415
§ 371 (c)(1),
(2) Date: Mar. 20, 2015

(87) PCT Pub. No.: WO2014/046465
PCT Pub. Date: Mar. 27, 2014

(65) Prior Publication Data
US 2015/0277208 A1   Oct. 1, 2015

(30) Foreign Application Priority Data

Sep. 21, 2012 (KR) .................. 10-2012-0105354
Mar. 27, 2013 (KR) .................. 10-2013-0032972

(51) Int. Cl.
*H01L 21/00* (2006.01)
*G02F 1/35* (2006.01)
(Continued)

(52) U.S. Cl.
CPC ........ *G02F 1/353* (2013.01); *H01L 31/02161* (2013.01); *H01L 31/03046* (2013.01);
(Continued)

(58) Field of Classification Search
None
See application file for complete search history.

(56) References Cited

U.S. PATENT DOCUMENTS 5,748,659 A * 5/1998 Kimura .................. H01S 5/227
                                                            372/46.01
6,373,559 B1    4/2002 Knupfer
(Continued)

FOREIGN PATENT DOCUMENTS

JP    2000-216425 A    8/2000
JP    2001-177143 A    6/2001
(Continued)

OTHER PUBLICATIONS

"How Metal Organic Chemical Vapor Deposition (MOCVD) Works." AZO Materials. Nov. 28, 2014. http://www.azom.com/article.aspx?ArticleID=11585. Aug. 17, 2016.*
(Continued)

*Primary Examiner* — Reema Patel
(74) *Attorney, Agent, or Firm* — Rabin & Berdo, P.C.

(57) ABSTRACT

Disclosed herein is a photomixer and method of manufacturing the photomixer which can fundamentally solve the existing restrictive factors of a PCA and a photomixer which are core parts of a conventional broadband terahertz spectroscopy system. The presented photomixer includes an active layer formed on a top surface of a substrate, the active
(Continued)

layer being formed on an area on which light is incident, and a thermal conductive layer formed on the top surface of the substrate, the thermal conductive layer being formed on an area other than the area on which light is incident. The active layer is formed to have a mesa cross section, and the thermal conductive layer is regrown on an area other than the area on which light is incident using an MOCVD method, and has a flattened surface.

13 Claims, 10 Drawing Sheets

(51) Int. Cl.
    H01L 31/0216    (2014.01)
    H01L 31/0304    (2006.01)
    H01L 31/14      (2006.01)
    H01L 31/18      (2006.01)
(52) U.S. Cl.
    CPC .......... *H01L 31/14* (2013.01); *H01L 31/1844* (2013.01); *G02F 2203/13* (2013.01)

(56) References Cited

U.S. PATENT DOCUMENTS

| 2003/0218226 | A1 | 11/2003 | Ito et al. |
| 2008/0265357 | A1 | 10/2008 | Toyonaka et al. |
| 2009/0321868 | A1 | 12/2009 | Nakaji |
| 2011/0149368 | A1 | 6/2011 | Kim et al. |
| 2012/0068090 | A1 | 3/2012 | Park |
| 2012/0153161 | A1 | 6/2012 | Han et al. |

FOREIGN PATENT DOCUMENTS

| JP | 2003-347577 A | 12/2003 |
| JP | 2008-270529 A | 11/2008 |
| JP | 2010-010450 A | 1/2010 |
| KR | 10-2011-0069453 A | 6/2011 |
| KR | 10-2012-0030186 A | 3/2012 |
| KR | 10-2012-0067629 A | 6/2012 |

OTHER PUBLICATIONS

"How MOCVD Works: Deposition Technology for Beginners" AIXTRON. May 2011. http://www.aixtron.com/fileadmin/documents/faq/MOCVD-Brochuere_E_LoRes.pdf. Aug. 17, 2016.*

A. C. Jones and M. L. Hitchman, "Overview of Chemical Vapour Deposition," in Chemical Vapour Deposition: Precursors, Processes and Applications, chapter 1, pp. 1-36, RSC Publishing, 2008.*

* cited by examiner

PHOTO MIXER AND METHOD FOR MANUFACTURING SAME

TECHNICAL FIELD

The present invention relates, in general, to a photomixer and method of manufacturing the photomixer and, more particularly, to a broadband photomixer that is the core of the generation of continuous frequency variable terahertz waves and to a method of manufacturing the broadband photomixer.

BACKGROUND ART

In the electromagnetic spectrum, a 0.1 to 10 THz (1 THz: $10^{12}$ Hz) band is defined as a terahertz wave band. In particular, a 0.1 to 3 THz band is a band in which rotational resonant frequencies of a great variety of molecules are present, and molecule detection or the like can be performed in a non-destructive manner, a non-open manner, or a non-contact manner by exploiting the terahertz wave band characteristics of such molecules. Such terahertz wave technology enables the provision of new concept future core technologies, which have not yet been introduced to date, in the fields of medical treatment, medicine, agriculture and food, environmental measurement, biology, communication, non-destructive investigation, advanced material evaluation, etc., and very fierce competition has been conducted in the development of related core technology.

In terahertz wave technology, since the energy of photons in the terahertz wave band is as very low as several meV, it scarcely influences a human body and is recognized as a core technology for realizing a human-centered ubiquitous society, and thus it is predicted that the demand for the terahertz wave technology will be rapidly increased. However, technology that can simultaneously satisfy real-time properties, portability, low price, broadband, etc. has not yet been developed. However, thanks to the continuous improvement of technical skills, various presentations related to the utilization of terahertz spectroscopy and imaging fields have currently been made. Unlike terahertz imaging fields in which a high-power wave source and a high-sensitive array detector are essentially adopted, a broadband terahertz wave source has been settled as core technology for the system in terahertz spectroscopy.

Figure 1:
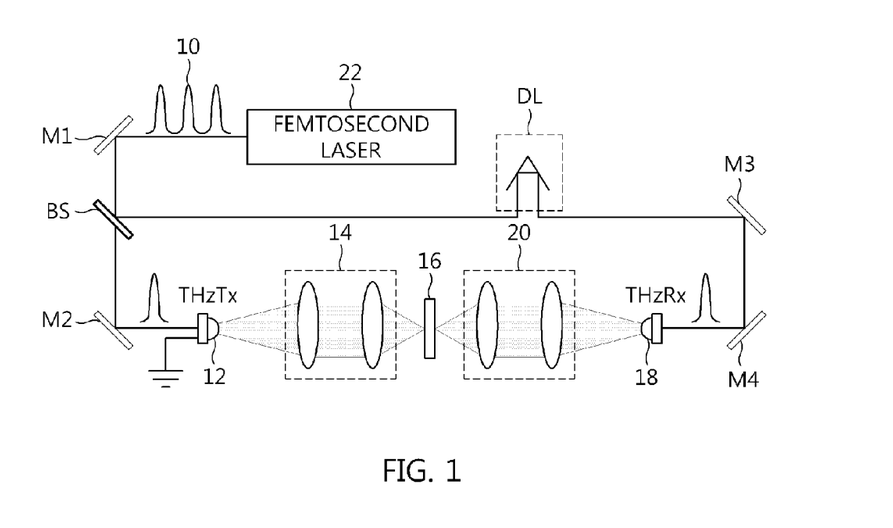
FIG. 1 is a diagram showing the concept of a typical terahertz (THz)-Time domain spectroscopy (TDS) system.

The broadband terahertz system that has been most widely used until recently is a terahertz (THz)-Time Domain Spectroscopy (TDS) system for radiating femtosecond ultrashort pulse laser light to a semiconductor having an ultrahigh response speed and generating terahertz waves, as can be seen in FIG. 1. Since a broadband terahertz spectroscopy system composed of a femtosecond high-output pulse laser and a Photoconductive Antenna (PCA) may be implemented to relatively easily provide high Signal-to-Noise Ratio (SNR) and broadband characteristics, it is the first commercialized system. The THz-TDS system of FIG. 1 is configured such that a femtosecond light pulse 10 from a single femtosecond laser 22, reflected by a mirror M1, is split into two femtosecond light pulses by a beam splitter BS. Of the two femtosecond light pulses, one femtosecond light pulse is reflected by a mirror M2 to excite a THz emitter 12, and the other femtosecond light pulse sequentially passes through an optical delay unit DL and mirrors M3 and M4 and is input to a THz detector 18. Two off-axis parabolic mirrors 14 disposed downstream of the THz emitter 12 focus THz beams from the THz emitter 12 on a sample 16, and two off-axis parabolic mirrors 20 condense the THz beams having passed through the sample 16 and focus the THz beams on the THz detector 18. At a position where paths of the left and right laser beams are exactly identical to each other, the maximum value of terahertz signals can be measured. Methods of measuring terahertz signals are performed using a sampling method based on a difference between optical paths by gradually changing the optical path of a right laser beam using the optical delay unit DL.

However, since the above-described THz-TDS system is implemented as a dedicated and complicated optical system including the femtosecond laser 22, the optical delay unit DL, etc., it is very expensive and has a large system size. In particular, the THz-TDS system of FIG. 1 has difficulty in real-time measurement due to time required for optical delay and time required to process a Fast Fourier Transform (FFT) on measured time domain signals. Such problems have been recognized as factors to be solved for the purpose of maximizing industrial utilization.

Figure 2:
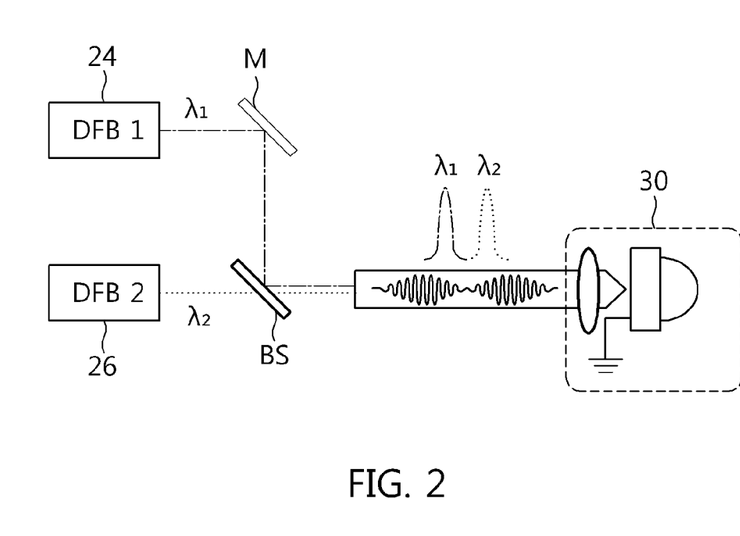
FIG. 2 is a diagram showing the concept of a typical THz-Frequency domain spectroscopy (FDS) system.

Recently, in addition to the THz-TDS system which is a scheme for generating pulsed broadband terahertz waves, a lot of effort to develop THz-Frequency Domain Spectroscopy (FDS) systems for generating continuous waves shown in FIG. 2 is currently being made. It is possible to provide high frequency resolution based on a continuous wave scheme and to develop an inexpensive, broadband, and micro-size system by utilizing two independent high-power semiconductor lasers, so that a terahertz spectroscopy system that can be applied to various fields can be developed, and a plurality of institutions are competitively developing related technologies. However, instances that are substantially applied in detail to systems are not presented due to very bad photoelectric conversion efficiency of the continuous wave scheme.

The THz-TDS system which is a pulsed broadband terahertz wave generation system shown in FIG. 1 generally uses a titanium sapphire (Ti: Sapphire) laser which is a femtosecond ultrashort pulse laser, and is implemented using a PCA which is a terahertz wave generator based on femtosecond light excitation, that is, an ultrahigh frequency photoelectric converter (optical-to-electrical converter). The center oscillation wavelength of a commercialized Ti: sapphire laser absorbs 800 nm, and the commercialized Ti: Sapphire laser uses low-temperature grown GaAs, which has a very short carrier lifetime, as a PCA active material. In the configuration of the terahertz spectroscopy system, it is required to adopt a material that efficiently absorbs an excitation light source or has a femtosecond-level carrier lifetime essential for broadband characteristics. In spite of the same scheme, an FDS system which is a continuous wave oscillation scheme shown in FIG. 2, unlike the pulsed TDS system shown in FIG. 1, has been developed and is in competition with the TDS system.

Figure 4:
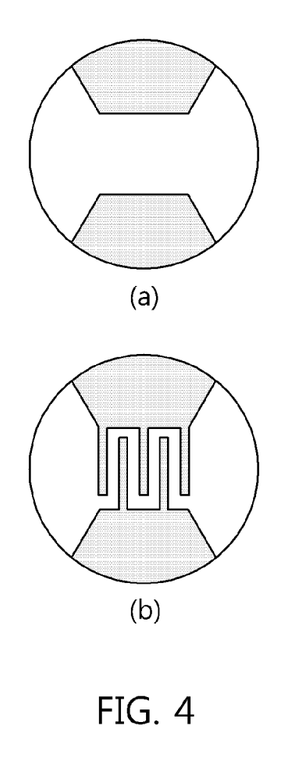
FIG. 4 is a diagram showing a form in which a photoconductive switch and an antenna shown in FIG. 3 are installed.

Compared to FIG. 1, a difference with FIG. 2 is that an excitation light source utilizes beating formed by two wavelengths $\lambda 1$ and $\lambda 2$ of very stable high-power distributed feedback lasers DFB1 24 and DFB2 26, rather than femtosecond lasers. The terahertz wave generation scheme except for the light source is similar to that of the THz-TDS system of FIG. 1. In the case of a PCA that is an ultrahigh frequency photoelectric converter for THz-TDS, broadband terahertz waves can be easily generated using a rectangular light excitation area having a size of several micro meters and a very simple dipole antenna owing to the high peak value of an ultrashort pulse laser. In contrast, the THz-FDS system of FIG. 2 is generally referred to as a photomixer instead of a PCA because terahertz waves having a frequency corresponding to a difference between two wavelengths are generated. For the development of a photomixer 30 for generating a continuous wave other than a pulsed wave, a finger-shaped interdigitated (IDT) pattern shown in FIG. 4 is utilized by exploiting a continuously oscillating light source at several tens of mW, unlike the femtosecond laser having a very high peak value. By utilizing the IDT pattern, it is possible to generate broadband terahertz waves even at relatively low input optical power although the optical power is easily saturated and is dependent on the polarization of incident light, and thus the photomixer has been widely utilized.

Figure 3:
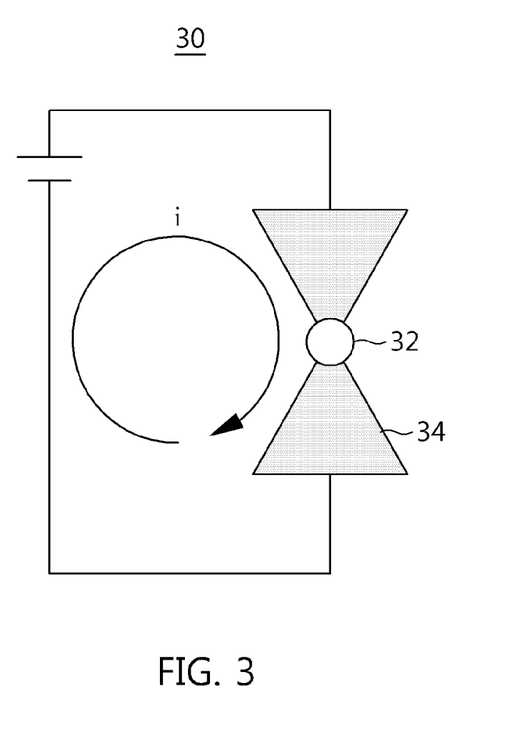
FIG. 3 is a configuration diagram of a typical photomixer.

FIG. 3 is a schematic diagram showing a typical photomixer. A photomixer 30, which is a device for generating broadband terahertz waves, includes a photoconductive switch (PCS) 32 made of a material, the reaction speed of which is as very high as picoseconds ($10^{-12}$), and configured to allow electric current to flow therethrough when light is radiated; and antennas 34 configured to acquire the gain of the generated terahertz waves in one direction. Meanwhile, referring to FIG. 4, it can be seen that the antennas 34 are formed on opposite sides of the PCS 32 of the photomixer 30, with the PCS 32 interposed between the antennas 34.

Korean Patent Application Publication No. 2011-0069453 (entitled "Photomixer module and method of generating terahertz waves using the same") discloses technology for increasing the intensity of excited light required to generate terahertz waves and improving the stability of a photomixer.

The photomixer module disclosed in Korean Patent Application Publication No. 2011-0069453 includes a semiconductor light amplifier configured to amplify incident laser light, and a photomixer configured to be excited by amplified laser light and configured to generate a continuous terahertz wave, wherein the semiconductor light amplifier and the photomixer are formed to be integrated into a single module.

The present invention is intended to develop a high-efficiency photomixer, which can fundamentally overcome the deterioration of characteristics due to the saturation of input light caused by the injection of a high-power excited light and a sudden increase in the temperature of the active layer of the photomixer caused by the injection of the excited light in a broadband photomixer, which is a continuous terahertz wave generation device, unlike a pulsed PCA. In particular, the background of the present invention is to develop broadband photomixer technology, which can rapidly improve broadband terahertz wave generation efficiency that was very low in a long wavelength band, and which has high efficiency and high reliability characteristics because previously well-developed parts for optical communication can be easily utilized.

DISCLOSURE

Technical Problem

The present invention has been proposed to solve the above problems in the prior art, and an object of the present invention is to provide a photomixer and method of manufacturing the photomixer, which can fundamentally solve the existing restrictive factors of a PCA and a photomixer which are core parts of a conventional broadband terahertz spectroscopy system.

Respective spectroscopy systems use various materials, such as low-temperature grown GaAs and InGaAs suitable for oscillation wavelengths of light sources, but the results thereof are still too weak to be industrialized due to the inherent characteristics of semiconductors. A detailed object of the present invention is to solve difficult problems resulting from the development of a broadband photomixer which is a photoelectric converter for generating enough terahertz waves to be industrialized by developing an embedded photomixer based on a Metal-Organic Chemical Vapor Deposition (MOCVD) regrowth method which has not yet been proposed to date.

Technical Solution

In accordance with an aspect of the present invention to accomplish the above object, there is provided a photomixer including an active layer formed on a top surface of a substrate, the active layer being formed on an area on which light is incident; and a thermal conductive layer formed on the top surface of the substrate, the thermal conductive layer being formed on an area other than the area on which light is incident.

Preferably, the active layer may have a mesa cross section.

The active layer may be formed as any one selected from among GaAs, InGaAs, and InGaAsP structures and an InGaAs/InAlAs multilayer thin film structure.

The thermal conductive layer may be made of any one selected from among InP, GaAs, Ge, Si, AlAs, and AlGaAs.

The active layer and the thermal conductive layer may come into close contact with each other.

The photomixer may further include an electrode pattern connected to one surface of the active layer and spaced apart from the thermal conductive layer.

The photomixer may further include a nonreflective film formed on the area on which light is incident, wherein the nonreflective film may be formed over the active layer and the thermal conductive layer.

Meanwhile, in accordance with another aspect of the present invention to accomplish the above object, there is provided a method of manufacturing a photomixer including forming an active layer on a top surface of a substrate, the active layer being formed on an area on which light is incident; and forming a thermal conductive layer on the top surface of the substrate, the thermal conductive layer being formed on an area other than the area on which light is incident.

Preferably, forming the active layer may include growing a buffer layer vertically and horizontally on the top surface of the substrate; growing the active layer vertically and horizontally on a top surface of the buffer layer; and etching the area other than the area on which light is incident from the grown active layer.

Growing the active layer vertically and horizontally may be configured to grow the active layer at a low temperature using a Molecular Beam Epitaxy (MBE) method.

The active layer may be formed to have a mesa cross section.

Forming the thermal conductive layer may be configured such that the thermal conductive layer is regrown on the area other than the area on which light is incident using an MOCVD method, and has a flattened surface.

The method may further include forming an electrode pattern connected to one surface of the active layer and spaced apart from the thermal conductive layer.

The method may further include forming a nonreflective film on the area on which light is incident.

Advantageous Effects

In accordance with the present invention having the above configuration, a heat treatment process is performed using MOCVD equipment which is semiconductor crystal growth equipment, so that the heat treatment of a low-temperature grown semiconductor material and high-quality semiconductor crystal growth are simultaneously performed to enable a structure having high thermal conduction properties and a flat-type structure to be developed, thus enabling the development of a broadband photomixer having high reliability and high efficiency.

A high-efficiency photomixer having the characteristics of a high-efficiency heat-dissipation structure while guaranteeing the reliability of photomixer elements using a low-temperate grown substrate is developed, and thus a substantial terahertz application system can be developed and the ripple effect on future technology development can be greatly improved.

BEST MODE

Hereinafter, a photomixer and method of manufacturing the photomixer according to embodiments of the present invention will be described in detail with reference to the attached drawings. Prior to the detailed description of the present invention, it should be noted that the terms or words used in the present specification and the accompanying claims should not be limitedly interpreted as having their common meanings or those found in dictionaries. Therefore, the embodiments described in the present specification and constructions shown in the drawings are only the most preferable embodiments of the present invention, and are not representative of the entire technical spirit of the present invention. Accordingly, it should be understood that various equivalents and modifications capable of replacing the embodiments and constructions of the present invention might be present at the time at which the present invention was filed.

The principal characteristics of a pulsed broadband terahertz wave generation system or a continuous frequency variable terahertz wave generation system are determined by the characteristics of an excitation light source and the efficiency of a Photoconductive Antenna (PCA), which is the above-described photoelectric converter, and a photomixer. Unlike a pulsed type, upon designing a continuous wave generation photomixer, a heat rise effect within the photomixer occurring due to very high input optical power must be essentially taken into consideration. The principal heat sources include the absorption of a material based on light injection, Joule heating based on current obtained depending on the application of a bias to the photomixer, etc. Since the early saturation of incident light caused by an increase in the internal temperature of the photomixer and the deterioration of photoelectric efficiency properties caused by the increase in the internal temperature are rapidly progressing, smooth heat release is essential for the guarantee of high efficiency. In particular, in a continuous wave scheme, smooth heat release is the most important core factor. Among various photoelectric converters, a long-wavelength photomixer that exhibits the worst characteristics is considered below.

A frequency f at which continuous frequency variable terahertz waves are generated is a beating frequency ($f=f_1-f_2$) which is a difference between two oscillation frequencies ($f_1=c/\lambda_1$, $f_2=c/\lambda_2$) of excited light. When $\lambda = \lambda_1$ and $\Delta\lambda = \lambda_1 - \lambda_2 \ll \lambda$, $f = f_1 - f_2 = c/\lambda_1 - c/\lambda_2 = c\,\Delta\lambda/\lambda^2$ may be represented.

The characteristics of the frequency variable terahertz wave source generated at this time are directly influenced by the characteristics of an excitation light source. All of the stability, line width, polarization, and phase of the excitation light source influence the generated terahertz waves, and thus a lot of effort has been taken to develop stable excitation light sources.

Figure 5:
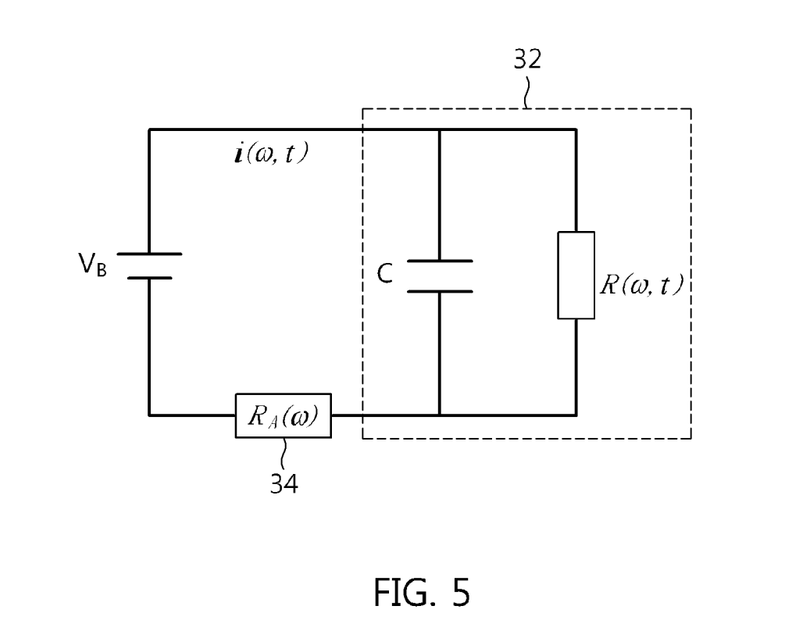
FIG. 5 is a diagram showing the equivalent circuit of a terahertz wave generation photomixer used to describe the present invention.

In order to analyze the output of terahertz waves generated by the photomixer, an equivalent circuit method shown in FIG. 5 is widely utilized. In FIG. 5, principal variables influencing the characteristics of the photomixer include an applied voltage $V_B$, antenna impedance $R_L$, the capacitance C of the photomixer, the photoconductance $G_0$ of the photomixer, etc. If an area Ap on which light is incident, light transmittance T, internal quantum efficiency $\eta_i$, a Planck's constant h, charge mobility $\mu$, a frequency v, and a carrier extinction time $\tau$ are taken into consideration, and a simple square photomixer in which no metal pattern is present in the light incident area is assumed, the photoconductance $G_0$ is given by the following Equation (1). In the following Equation (1), e denotes the electric charge of carriers and $P_0$ denotes the power of light incident on the photomixer.

$$G_0 = \left(\frac{\mu e \tau \eta_i T}{h v}\right)\frac{P_0}{A_p} \qquad (1)$$

The characteristics of terahertz waves output from the photomixer having the photoconductance $G_0$ are given by the following Equation (2). $R_A$ denotes the radiation resistance of an antenna, and C and $\tau$ respectively denote the capacitance and carrier extinction time of the photomixer.

$$P_{THz}(\omega) = \frac{\frac{1}{2}R_A G_0^2 V_B^2}{(1+(\omega\tau)^2)(1+(\omega R_A C)^2)} \qquad (2)$$

In Equation (2), $\omega$ denotes the angular frequency of the beating frequency.

$$\omega = 2\pi f = 2\pi(f_1 - f_2) = 2\pi(c/\lambda_1 - c/\lambda_2).$$

In order to generate high-efficiency terahertz waves, variables directly influencing the photoelectric conversion efficiency of the photomixer together with a high-power light source must be adjusted. As shown in Equation (2), power is influenced by the high response speed, antenna resistance, input light intensity, etc. of the photomixer. In the case of the PCA which is a pulsed terahertz wave generator, the deterioration of characteristics caused by excited light is relatively less influenced than in a continuous wave. However, in the case of the continuous wave generation photomixer, a junction temperature $T_j$ formed at the interface between air and the semiconductor due to an increase in the temperature of the active layer caused by continuous injection and absorption of input light and Joule heating caused by the application of a bias determines the maximum value of incident light, and thus this is a factor to be essentially solved for the development of a high efficiency photomixer.

As can be seen in Equations (1) and (2), the characteristics of a broadband photomixer are greatly influenced by a very short carrier extinction time and the capacitance characteristics of the photomixer. Of these factors, the carrier extinction time which directly influences broadband characteristics in a terahertz spectroscope must be essentially secured. For the purpose of securing the carrier extinction time, Molecular Beam Epitaxy (MBE) equipment is used to grow a semiconductor material having a very short carrier extinction time with semiconductor single crystal properties maintained. The carrier extinction time of a typical semiconductor is about several ns ($10^{-9}$), and time corresponding to 1 THz is about 1 picosecond ($10^{-12}$), so that if the growth temperature is suddenly decreased when semiconductor crystals are grown so as to guarantee broadband characteristics, impurities are generated due to the occupation of a group 5 element at a group 3 element position in the material, thus securing a femtosecond-level carrier extinction time.

Although described above, a GaAs material has been used to absorb light power having a wavelength of 800 nm which is the center oscillation wavelength of the light source of the THz TDS system, that is, a Ti: Sapphire laser, or, alternatively, an InGaAs material has been mainly used to absorb a long wavelength beating light source used for continuous wave oscillation. The differentiation of a method newly proposed in the present invention from a typically utilized photomixer manufacture method is intended to be described by comparing the method of the present invention with the typically utilized photomixer manufacture method.

As shown in FIGS. 3 to 5, the photomixer includes a photoconductive switch 32 made of a material rapidly reacting to excited light, and antennas 34 configured to extract generated waves in an arbitrary desired direction. Here, the antennas 34 may be adopted as bowtie antennas, dipole antennas, etc. depending on the purpose of the antennas. For a terahertz spectroscopy system, a broadband antenna must be essentially used, and for a terahertz imaging system, high efficiency resonant antennas are used.

Figure 6:
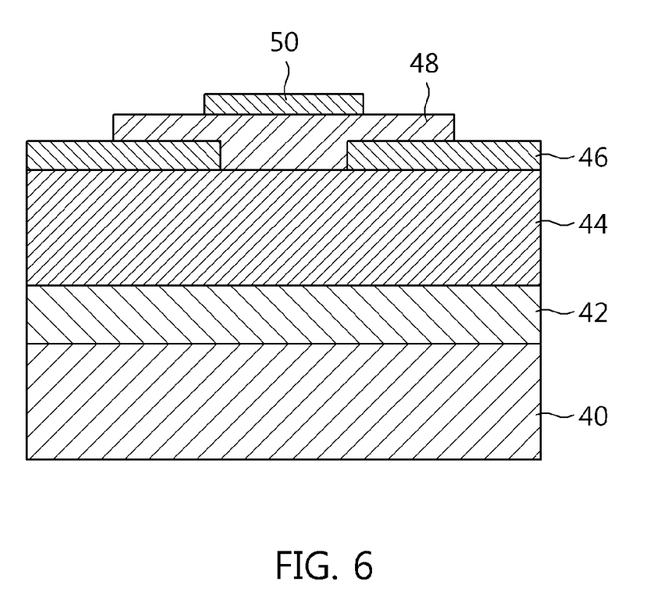
FIG. 6 is a diagram showing the structure of a flat-type terahertz wave generation photomixer used to describe the present invention.

The simplest photomixer in which only antennas enabling a bias to be applied to a material securing a carrier extinction time is manufactured are illustrated in FIG. 6.

The photomixer of FIG. 6 includes a substrate 40, a buffer layer 42, an active layer 44, an insulating thin film 46, an electrode pattern 48, and a nonreflective film 50.

The substrate 40 may be made of semi-insulating GaAs or InGaAs so as to minimize the amount of terahertz waves absorbed by charges present on the corresponding substrate. The substrate 40 may be grown to a predetermined thickness by using Molecular Beam Epitaxy (MBE) equipment.

The buffer layer 42 is formed on the top surface of the substrate 40. The buffer layer 42 is formed to grow a normal semiconductor thin film on the substrate 40. In order to grow the buffer layer 42, a material, such as AlGaAs, InAlAs, GaAs, or InP, may be used. By utilizing the MBE equipment, the buffer layer 42 may be grown to a predetermined thickness.

The active layer 44 is formed vertically and horizontally on the top surface of the buffer layer 42. The active layer 44 is grown using a low-temperature growth method so as to secure a carrier lifetime. The active layer 44 may be regarded as the core of the manufacture of the photomixer and may also be referred to as a photoconductive layer. The active layer 44 may generate terahertz waves from photoconductive switching. Semiconductor thin films used for the active layer 44 may include a GaAs material in 800 nm band as a bulk material and include an InGaAs or InGaAsP material, the band gap of which is identical to the wavelength of the excitation light source, as a long wavelength band material. In addition to the bulk active layer, a multi-layer thin film structure such as InGaAs/InAlAs may be adopted so as to smoothly capture electrons and holes generated by a long wavelength excitation light source.

As can be seen in Equation (2), the power of terahertz waves is determined in proportion to the square of the applied voltage, and the formation of an electrode including the antenna enabling a bias to be applied to the photoconductive switch is essential. Accordingly, the insulating thin film 46 and the electrode pattern 48 are sequentially formed on the top surface of the active layer 44 through a series of lithography processes. Here, the electrode pattern 48 may be regarded as being connected to the antenna. In this way, as the buffer layer 42, the active layer 44, the insulating thin film 46, and the metal electrode pattern 48 are sequentially formed on the substrate 40, it can be seen that a photomixer chip has been completed.

The nonreflective film 50 is intended to finally prevent surface reflection from decreasing due to the semiconductor. First, a nonreflective film layer is formed on the entire top surface of the electrode pattern 48, and thereafter the nonreflective film 50 is formed only on an area on which light is incident, through the lithography process.

Figure 7:
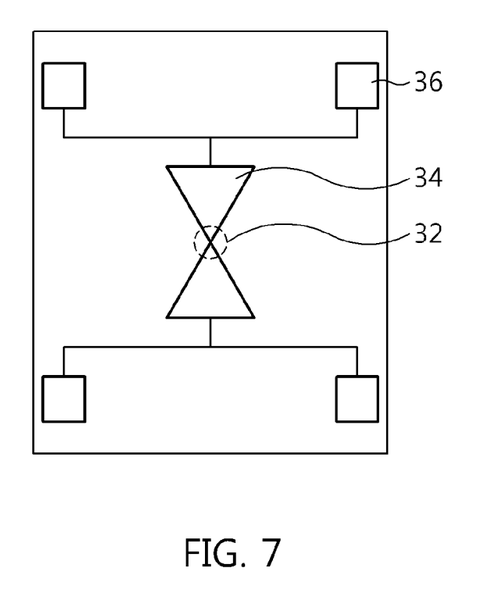
FIG. 7 is a diagram showing an antenna-integrated terahertz wave generation photomixer used to describe the present invention.

FIG. 7 is a diagram showing an antenna-integrated terahertz wave generation photomixer used to describe the present invention. In FIG. 7, two bowtie antennas 34 which are broadband antennas are integrated. Of the two bowtie antennas 34, one may be used to apply a bias voltage and the other may be grounded. Further, in FIG. 7, a plurality of electrode pads 36 are connected for packaging to each bowtie antenna 34. The electrode pads 36 may include a bias electrode pad and a ground electrode pad. Furthermore, the photoconductive switch 32 which is the core part of the photomixer is formed within a portion indicated by a dotted line (that is, between the two bowtie antennas 34).

In FIG. 7, the photoconductive switch 32 may be made of the material of the above-described active layer 44, wherein it is well known that, unlike a GaAs material having a large band gap among low-temperature grown materials, a InGaAs material has n-type semiconductor characteristics due to background charges. In order to cancel such n-type charges, beryllium (Be) that is a p-type material is doped to the low-temperature grown InGaAs. As a result of Hall measurement, as heat treatment temperature becomes higher, beryllium (Be) is activated, and then n-type impurities are desirably cancelled. This means that, as heat treatment temperature is raised, low-temperature grown InGaAs having higher dark resistivity may be obtained.

In the case of FIG. 6, since a low-temperature grown semiconductor area still remains in addition to the area into which light is injected, dark current is generated due to background charge density. Generally, since, in a GaAs PCA, such a low-temperature grown semiconductor area may be ignored, and a high bias voltage may be used. However, in the case of a long wavelength photomixer, as a main factor deteriorating its characteristics, the deterioration of background charge density may be considered. For this reason, the low-temperature grown semiconductor material has very low mobility characteristics. In order to improve mobility that decisively influences the power of terahertz waves, a heat treatment process is essentially performed after growth. For example, in the case of InGaAs, the Hall mobility of an as-grown InGaAs sample is greatly increased from about 600 $cm^2$/Vsec to a large value such as about 1,450 $cm^2$/Vsec after the heat treatment process has been performed, and the as-grown InGaAs sample exhibits the characteristics of being restored to a material in a steady state as the heat treatment temperature increases, and thus suitable heat treatment temperature is essential for the manufacture of a high efficiency photomixer.

Figure 8:
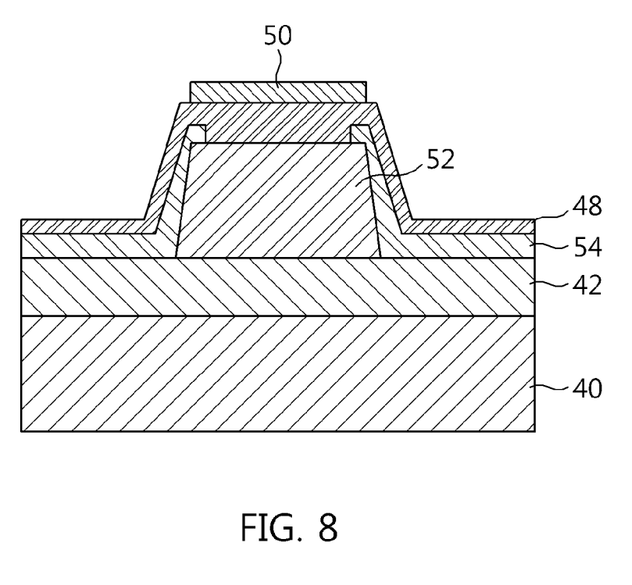
FIG. 8 is a diagram showing a modification of FIG. 7.

Accordingly, in order to decrease dark current directly influencing the characteristics of the photomixer, the structure of FIG. 8 may be considered. In FIG. 8, the functions of respective layers of the photomixer are identical to those of FIG. 6, and the structure of FIG. 8 is implemented such that only an area on which light is incident is left with the remaining area removed through etching. In FIG. 8, an active layer 52 has a mesa cross section. In this way, when the active layer 52 has the mesa cross section, a low-temperature grown semiconductor area other than the light injected area is not present, and thus the generation of dark current caused by background charge density will not occur. In FIG. 8, reference numeral 54, not described here, denotes an insulating thin film.

In order to improve the characteristics of the photomixer, a heat treatment process is essentially required so as to secure the mobility of the active layer 44 that is a light exciting part in FIG. 6 and the active layer 52 that is a light exciting part in FIG. 8. In this case, the heat treatment process is performed by executing in-situ annealing performed in an MBE chamber immediately after growth has been terminated using MBE equipment that is low-temperature growth equipment, or ex-situ annealing performed in a Rapid Thermal Annealing (RTA) chamber. It can be experimentally proved that, since the surface of the sample for which the in-situ heat treatment or ex-situ heat treatment is undergone is rough, a considerable problem is caused in the photomixer process and characteristics.

Meanwhile, since, in the photomixer of FIG. 8, the active layer 52 is formed in a mesa shape, an electrode pattern 48 on the active layer 52 is also formed in a shape similar to the mesa shape. Accordingly, the electrode pattern 48 of FIG. 8 is not flat, unlike the electrode pattern of FIG. 6. Thus, the photomixer of FIG. 8 results in disparity between the height of the active layer 52 and the surfaces of the antennas. Due to such a disparity, difficulty in processing is present, and most parts of the photomixer, except for the substrate, are exposed to the air, and thus it is difficult to predict high release efficiency for heat generated upon exciting light.

Figure 9:
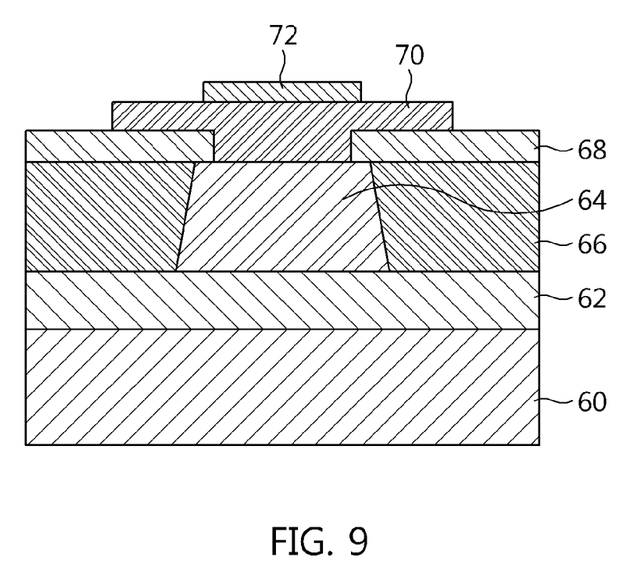
FIG. 9 is a diagram showing the structure of a photomixer according to a preferred embodiment of present invention.

Accordingly, the photomixer having the structure of FIG. 9 is presented. As described above, in a low-temperature growth process for securing broadband characteristics, a subsequent heat treatment process for securing mobility is essential for the development of a broadband photomixer.

The photomixer of FIG. 9 includes a substrate 60, a buffer layer 62, an active layer 64, a thermal conductive layer 66, an insulating thin film 68, an electrode pattern 70, and a nonreflective film 72. Here, the functions of the substrate 60, the buffer layer 62, and the active layer 64 are identical to those of the substrate 40, the buffer layer 42, and the active layer 52 of FIG. 8. The functions of the insulating thin film 68, the electrode pattern 70, and the nonreflective film 72 are identical to those of the insulating thin film 46, the electrode pattern 48, and the nonreflective film 50 of FIG. 6.

In FIG. 9, there is a peculiarity in that the active layer 64 and the thermal conductive layer 66 are formed on the top surface of the buffer layer 62, but the active layer 64 is formed in an area on which light is incident and the thermal conductive layer 66 is formed in the area other than the light incident area. The thermal conductive layer 66 is made of a material having very high thermal conductivity. In order to release heat, it is preferable that the active layer 64 and the thermal conductive layer 66 come into close contact with each other.

As can be seen through the structure of FIG. 9, a heat treatment process and a flattening process for regrowing a material having very high thermal conductivity on the area other than a light excitation area (that is, the light incident area corresponds thereto) using MOCVD equipment and flattening the area are simultaneously performed. The characteristics greatly enhanced by simultaneously solving a surface problem caused by heat treatment and the problem of deterioration of photomixer characteristics using a method that has not yet been presented to date were experimentally verified. That is, in the embodiment of the present invention, heat treatment was performed in an As atmosphere by using the MOCVD equipment which is semiconductor crystal growth equipment. The results of experiments exhibited that a rapid variation in carrier lifetime did not occur up to a predetermined threshold temperature. Further, most of all, when heat treatment was performed in an As atmosphere using the MOCVD equipment which is conventional semiconductor crystal growth equipment, it could be experimentally verified that excellent surface characteristics and carrier lifetime that were incomparable to other methods could be secured when the comparison with the other methods was made.

As a regrown material used for the thermal conductive layer 66, a great variety of materials may be taken into consideration in light of lattice matching with various active layers, the thermal conductivity of the regrown material, etc. Possible material names (thermal conductivity) may be presented as follows. InP(0.68 $Wcm^{-1}K^-$), GaAs(0.45 $Wcm^{-1}K^{-1}$), Ge(0.58 $Wcm^{-1}K^{-1}$), Si(1.3 $Wcm^{-1}K^{-1}$), and AlAs(0.91 $Wcm^{-1}K^{-1}$) are materials having very high thermal conductivity, and configured such that the area other than the light excitation area is embedded, thus enabling a very thermally stable photomixer to be developed. It could be experimentally verified that, if this structure was actually utilized, the characteristics thereof could be rapidly improved.

In FIG. 9, the active layer 64 may be formed as all of photomixer active layers based on light excitation, such as low-temperature grown GaAs, InGaAs, and InGaAsP, and InGaAs/InAlAs multilayer thin films. The thermal conductive layer 66 regrown using the MOCVD equipment makes it a rule to regrow a bulk semiconductor, such as InP, AlAs, or AlGaAs having very high thermal conductivity. However, a p-type or n-type semiconductor having another doping in the structure of a device may be regrown, and a junction structure in which p-type and n-type semiconductors are alternately grown may also be utilized. When the embedded photomixer shown in FIG. 9 is used, a photoelectric converter that is very stable and is capable of proving high efficiency characteristics may be developed, and the expansion of terahertz application systems that have not yet been presented is expected.

In the case of the photomixer of FIG. 9, an electric field (E) is formed in the active layer 64 due to a bias voltage applied to the electrode pattern 70 connected to the antenna. When excited light is incident in such a biased state, carriers (electron-hole pairs) are generated in the active layer 64 by means of light absorption. The carriers are accelerated by the electric field (E) formed in the active layer 64, and are then instantaneously moved to the antenna through the electrode pattern 70. Terahertz waves are generated in the antenna by photocurrent flowing during the lifetime of the carriers (about several hundred femtoseconds). Further, heat generated during light excitation is promptly released to the outside through the thermal conductive layer 66.

Figure 10:
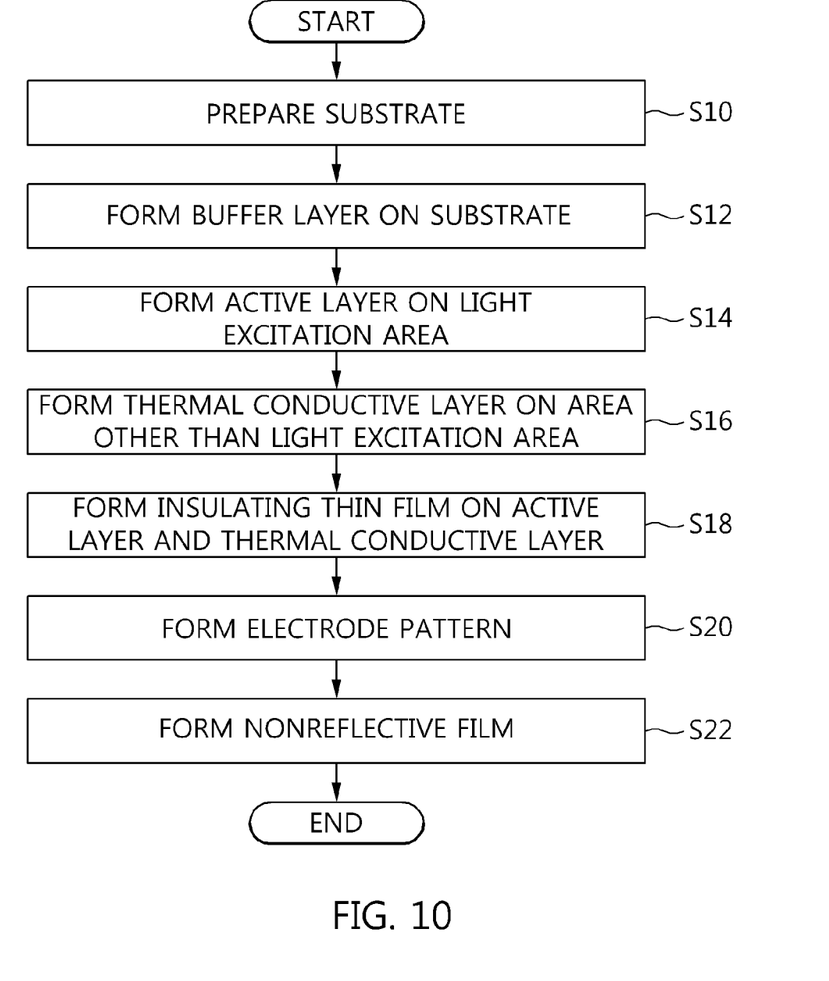
FIG. 10 is a flowchart showing a method of manufacturing a photomixer according to a preferred embodiment of the present invention.

FIG. 10 is a flowchart showing a method of manufacturing a photomixer according to a preferred embodiment of the present invention.

First, a substrate 60 grown to a predetermined thickness using MBE equipment is prepared (S10).

A buffer layer 62 is formed on the top surface of the substrate 60 (S12). Here, the buffer layer 62 is grown vertically and horizontally to a predetermined thickness using the MBE equipment.

An active layer 64 is formed on the top surface of the buffer layer 62 (S14). Upon forming the active layer 64, the active layer 64 is formed vertically and horizontally on the top surface of the buffer layer 62 using a low temperature growth method based on the MBE equipment. Alternatively, the active layer 64 is grown vertically and horizontally on the top surface of the buffer layer 62 using an MOCVD method, and thereafter ion-implantation may also be performed on the top surface of the active layer using ions such as $F^{2+}$.

In this way, in the active layer 64 formed by growing the active layer 64 vertically and horizontally using the low temperature growth method based on the MBE equipment, or formed by growing the active layer 64 vertically and horizontally using the MOCVD method and performing ion-implantation, the area other than an area on which light is incident (that is, a light excitation area) is removed through etching. Accordingly, the active layer 64 has a mesa cross section.

Thereafter, a thermal conductive layer 66 is regrown in the area other than the light incident area using the MOCVD method, and then a flattened surface is obtained (S16). Here, if a heat treatment process using the MOCVD method and a flattening process have been performed, the surface of the active layer 64, as well as the surface of the thermal conductive layer 66, is also actually flattened.

An insulating thin film 68 is formed on the top surfaces of the active layer 64 and the thermal conductive layer 66 through a lithography process (S18).

Then, an electrode pattern 70 connected to one surface of the active layer 64 and spaced apart from the thermal conductive layer 66 is formed (S20).

Finally, after a nonreflective film layer has been formed on the entire top surface of the electrode pattern 70, a nonreflective film 72 is formed only on an area on which light is incident through the lithography process (S22).

Meanwhile, the present invention is not limited to the above-described embodiments and may be changed and modified, without departing from the gist of the present invention, and it should be understood that the technical spirit of such changes and modifications also belong to the scope of the accompanying claims.

The invention claimed is:

1. A photomixer comprising:
    an active layer formed on a top surface of a substrate, the active layer being formed on an area on which light is incident;
    a thermal conductive layer formed on the top surface of the substrate, the thermal conductive layer being formed on an area other than the area on which light is incident, and
    an electrode pattern connected to one surface of the active layer and spaced apart from the thermal conductive layer,
    wherein the thermal conductive layer is formed by using an MOVCD method so that a top surface of the thermal conductive layer and a top surface of the active layer extend along substantially a same flat line.

2. The photomixer of claim 1, wherein the active layer has a mesa cross section.

3. The photomixer of claim 1, wherein the active layer is formed as any one selected from among the group of GaAs, InGaAs, and InGaAsP structures and an InGaAs/InAlAs multilayer thin film structure.

4. The photomixer of claim 1, wherein the thermal conductive layer is made of any one selected from among the group of InP, GaAs, Ge, Si, AIAs, and AIGaAs.

5. The photomixer of claim 1, wherein the active layer and the thermal conductive layer come into contact with each other.

6. The photomixer of claim 1, further comprising a nonreflective film formed on the area on which light is incident, wherein the nonreflective film is formed over the active layer.

7. A method of manufacturing a photomixer comprising:
    forming an active layer on a top surface of a substrate, the active layer being formed on an area on which light is incident;
    forming a thermal conductive layer on the top surface of the substrate, the thermal conductive layer being formed on an area other than the area on which light is incident, and
    forming an electrode pattern connected to one surface of the active layer and spaced apart from the thermal conductive layer,
    wherein forming the thermal conductive layer is configured such that the thermal conductive layer is regrown on the area other than the area on which light is incident using an MOCVD method, and such that a top surface of the thermal conductive layer and a top surface of the active layer extend along substantially a same flat line.

8. The method of claim 7, wherein forming the active layer comprises:
    growing a buffer layer vertically and horizontally on the top surface of the substrate;
    growing the active layer vertically and horizontally on a top surface of the buffer layer; and
    etching the area other than the area on which light is incident from the grown active layer.

9. The method of claim 8, wherein growing the active layer vertically and horizontally is configured to grow the active layer at a low temperature using a Molecular Beam Epitaxy (MBE) method.

10. The method of claim 8, wherein growing the active layer vertically and horizontally is configured to grow the active layer using a Metal-Organic Chemical Vapor Deposition (MOCVD) method and to perform thereon ion-implantation.

11. The method of claim 7, wherein the active layer is formed to have a mesa cross section.

12. The method of claim 7, wherein the thermal conductive layer is made of any one selected from among the group of InP, GaAs, Ge, Si, AlAs, and AlGaAs.

13. The method of claim 7, further comprising forming a nonreflective film on the area on which light is incident.

* * * * *